United States Patent
Cranford, Jr. et al.

(10) Patent No.: US 7,349,498 B2
(45) Date of Patent: Mar. 25, 2008

(54) METHOD AND SYSTEM FOR DATA AND EDGE DETECTION WITH CORRELATION TABLES

(75) Inventors: Hayden C Cranford, Jr., Apex, NC (US); Vernon R. Norman, Cary, NC (US); Martin L. Schmatz, Rueschlikon (CH)

(73) Assignee: International Business Machines Corporation, Armonk, NY (US)

( * ) Notice: Subject to any disclaimer, the term of this patent is extended or adjusted under 35 U.S.C. 154(b) by 869 days.

(21) Appl. No.: 10/265,981

(22) Filed: Oct. 7, 2002

(65) Prior Publication Data

US 2004/0066864 A1   Apr. 8, 2004

(51) Int. Cl.
*H04L 27/06* (2006.01)
*H03D 27/06* (2006.01)

(52) U.S. Cl. .................. 375/343; 375/142; 375/143; 375/150; 375/151; 375/152

(58) Field of Classification Search ........ 375/142–143, 375/150–152
See application file for complete search history.

(56) References Cited

U.S. PATENT DOCUMENTS

| | | | |
|---|---|---|---|
| 4,984,249 A | 1/1991 | Long et al. | |
| 5,343,406 A * | 8/1994 | Freeman et al. | 716/16 |
| 5,579,321 A | 11/1996 | Van Grinsven et al. | |
| 5,689,533 A | 11/1997 | Brauns et al. | |
| 5,706,314 A * | 1/1998 | Davis et al. | 375/340 |
| 5,838,745 A | 11/1998 | Wang et al. | |
| 5,901,189 A * | 5/1999 | Rose | 375/368 |
| 6,430,240 B1 * | 8/2002 | Eglit | 375/355 |
| 6,603,827 B2 * | 8/2003 | Bottomley et al. | 375/350 |
| 6,765,975 B2 * | 7/2004 | Dunning et al. | 375/371 |
| 2003/0076905 A1 * | 4/2003 | Schetelig et al. | 375/343 |

FOREIGN PATENT DOCUMENTS

JP        8084047        3/1996

* cited by examiner

*Primary Examiner*—Curtis B. Odom
(74) *Attorney, Agent, or Firm*—Sawyer Law Group LLP

(57) ABSTRACT

A system and method is disclosed for evaluating a data group of oversampled bits to detect edge transitions and for improving use of information available from a sampled data while maintaining acceptable noise rejection. An edge detection system for receiving a serial data stream includes a sampler for collecting a sample pattern from the serial data stream, the sample pattern including a succession of a plurality of data samples from the data stream with the plurality of data samples including multiple samples during a bit time associated with the data stream; a memory, coupled to the sampler, for storing one or more successive sample patterns; and a correlator, coupled to the memory, for producing a sample condition signal using a set of predefined patterns by comparing the stored sampled patterns to the predefined patterns.

8 Claims, 2 Drawing Sheets

| pattern | EL | | pattern | EL | | pattern | EL | | pattern | EL | |
|---|---|---|---|---|---|---|---|---|---|---|---|
| 0000000 | 00 | G | 1111111 | 00 | G | 0100101 | 00 | - | 1011010 | 00 | - |
| 0000001 | 01 | * | 1111110 | 01 | * | 1010010 | 00 | - | 0101101 | 00 | - |
| 1000000 | 10 | * | 0111111 | 10 | * | 0110010 | 00 | - | 1001101 | 00 | - |
| 0000010 | 00 | - | 1111101 | 00 | - | 0100110 | 00 | - | 1011001 | 00 | - |
| 0100000 | 00 | - | 1011111 | 00 | - | 0100111 | 00 | - | 1011000 | 00 | - |
| 0000011 | 00 | G | 1111100 | 00 | G | 1110010 | 00 | - | 0001101 | 00 | - |
| 1100000 | 00 | G | 0011111 | 00 | G | 0101001 | 00 | - | 1010110 | 00 | - |
| 0000100 | 00 | - | 1111011 | 00 | - | 1001010 | 00 | - | 0110101 | 00 | - |
| 0010000 | 00 | - | 1101111 | 00 | - | 0101010 | 00 | - | 1010101 | 00 | - |
| 0000101 | 00 | - | 1111010 | 00 | - | 0101011 | 00 | - | 1010100 | 00 | - |
| 1010000 | 00 | - | 0101111 | 00 | - | 1101010 | 00 | - | 0010101 | 00 | - |
| 0000110 | 10 | ? | 1111001 | 10 | ? | 0110001 | 01 | - | 1001110 | 01 | ? |
| 0110000 | 01 | ? | 1001111 | 01 | ? | 1000110 | 10 | - | 0111001 | 10 | ? |
| 0000111 | 10 | * | 1111000 | 10 | * | 0110011 | 00 | - | 1001100 | 00 | - |
| 1110000 | 01 | * | 0001111 | 01 | * | 1100110 | 00 | - | 0011001 | 00 | - |
| 0001001 | 00 | - | 1110110 | 00 | - | 1000001 | 00 | - | 0111110 | 00 | - |
| 1001000 | 00 | - | 0110111 | 00 | - | 1000011 | 00 | G | 0111100 | 00 | G |
| 0001010 | 00 | - | 1110101 | 00 | - | 1100001 | 00 | G | 0011110 | 00 | G |
| 0101000 | 00 | - | 1010111 | 00 | - | 1000101 | 00 | - | 0111010 | 00 | - |
| 0001011 | 00 | - | 1110100 | 00 | - | 1010001 | 00 | - | 0101110 | 00 | - |
| 1101000 | 00 | - | 0010111 | 00 | - | 1000111 | 10 | * | 0111000 | 10 | * |
| 0010001 | 00 | - | 1101110 | 00 | - | 1110001 | 01 | * | 0001110 | 01 | * |
| 1000100 | 00 | - | 0111011 | 00 | - | 1001001 | 00 | - | 0110110 | 00 | - |
| 0010010 | 00 | - | 1101101 | 00 | - | 1001011 | 00 | - | 0110100 | 00 | - |
| 0100100 | 00 | - | 1011011 | 00 | - | 1101001 | 00 | - | 0010110 | 00 | - |
| 0010011 | 00 | - | 1101100 | 00 | - | 1010011 | 00 | - | 0101100 | 00 | - |
| 1100100 | 00 | - | 0011011 | 00 | - | 1100101 | 00 | - | 0011010 | 00 | - |
| 0100001 | 00 | - | 1011110 | 00 | - | 1100011 | 00 | G | 0011100 | 00 | G |
| 1000010 | 00 | - | 0111101 | 00 | - | 1100111 | 10 | ? | 0011000 | 10 | ? |
| 0100010 | 00 | G | 1011101 | 00 | G | 1110011 | 01 | ? | 0001100 | 01 | ? |
| 0100011 | 00 | G | 1011100 | 00 | G | 1101011 | 00 | - | 0010100 | 00 | - |
| 1100010 | 00 | G | 0011101 | 00 | G | 1110111 | 00 | - | 0001000 | 00 | - |

G = Good No Change
? = Probable Need to Move
* = Clear Need to Move
- = Not Enough Info

FIG. 2

METHOD AND SYSTEM FOR DATA AND EDGE DETECTION WITH CORRELATION TABLES

FIELD OF THE INVENTION

The present invention relates generally to processing sample data from an oversampling clock/data recovery system, and more specifically to improving use of information available from the sampled data while maintaining acceptable noise rejection.

BACKGROUND OF THE INVENTION

Although it is well known to use oversampling clock/data recovery systems, and it is a frequent goal of those systems to extract timing information from an input serial data stream. The timing information is typically extracted by looking at signal edges, and when those detected edges occur in time with respect to each other. Noise in the input data stream complicates the identification and use of data edge clock/data recovery systems.

Prior art analog solutions often use phase detectors which use an exclusive OR (XOR) algorithm appropriate for the application and data, or which use latches that trigger on the different edge movements. Prior art digital solutions that use phase lock loops also traditionally use XOR gates. For those applications having lots of data, such as in serial transmission systems, the prior art clock/data recovery system performs an XOR operation between one sampled bit and the next sampled bit. Changes from one sampled bit to another are taken to indicate an edge. The problem with this solution is that it is not very robust and does not handle noise or other data distortions or artifacts in the input data stream very well. In one sample time in which a single edge transition may properly occur, the data stream or sampling may have multiple transitions that are not properly handled by the XOR algorithm. The XOR system is unable to use all the information in the sampled data that might indicate that the sample is not good, or unable to indicate that in certain situations, even when there are multiple transitions, the data sample is still able to provide meaningful edge information.

Accordingly, what is needed is a system and method for more accurately and efficiently evaluating a data group of oversampled bits to detect edge transitions and to improve use of information available from a sampled data while maintaining acceptable noise rejection. The present invention addresses such a need.

SUMMARY OF THE INVENTION

A system and method is disclosed for evaluating a data group of oversampled bits to detect edge transitions and for improving use of information available from a sampled data while maintaining acceptable noise rejection. An edge detection system for receiving a serial data stream includes a sampler for collecting a sample pattern from the serial data stream, the sample pattern including a succession of a plurality of data samples from the data stream with the plurality of data samples including multiple samples during a bit time associated with the data stream; a memory, coupled to the sampler, for storing one or more successive sample patterns; and a correlator, coupled to the memory, for producing a sample condition signal using a set of predefined patterns by comparing the stored sampled patterns to the predefined patterns. An edge detection method includes the steps of: collecting a sample pattern from a serial data stream, the sample pattern including a succession of a plurality of data samples from the data stream with the plurality of data samples including multiple samples during a bit time associated with the data stream; storing one or more successive sample patterns; and producing a sample condition signal using a set of predefined patterns by comparing the stored sampled patterns to the predefined patterns.

The system is able to make use of as much of a data sample as is meaningful to efficiently and accurately detect edges in a sampled word while having some robustness in rejecting pseudo edges that may be caused by noise or other data artifacts.

BRIEF DESCRIPTION OF THE DRAWINGS

FIG. 2 is a chart depicting a preferred embodiment for patterns and the corresponding output information.

DETAILED DESCRIPTION

Figure 1:
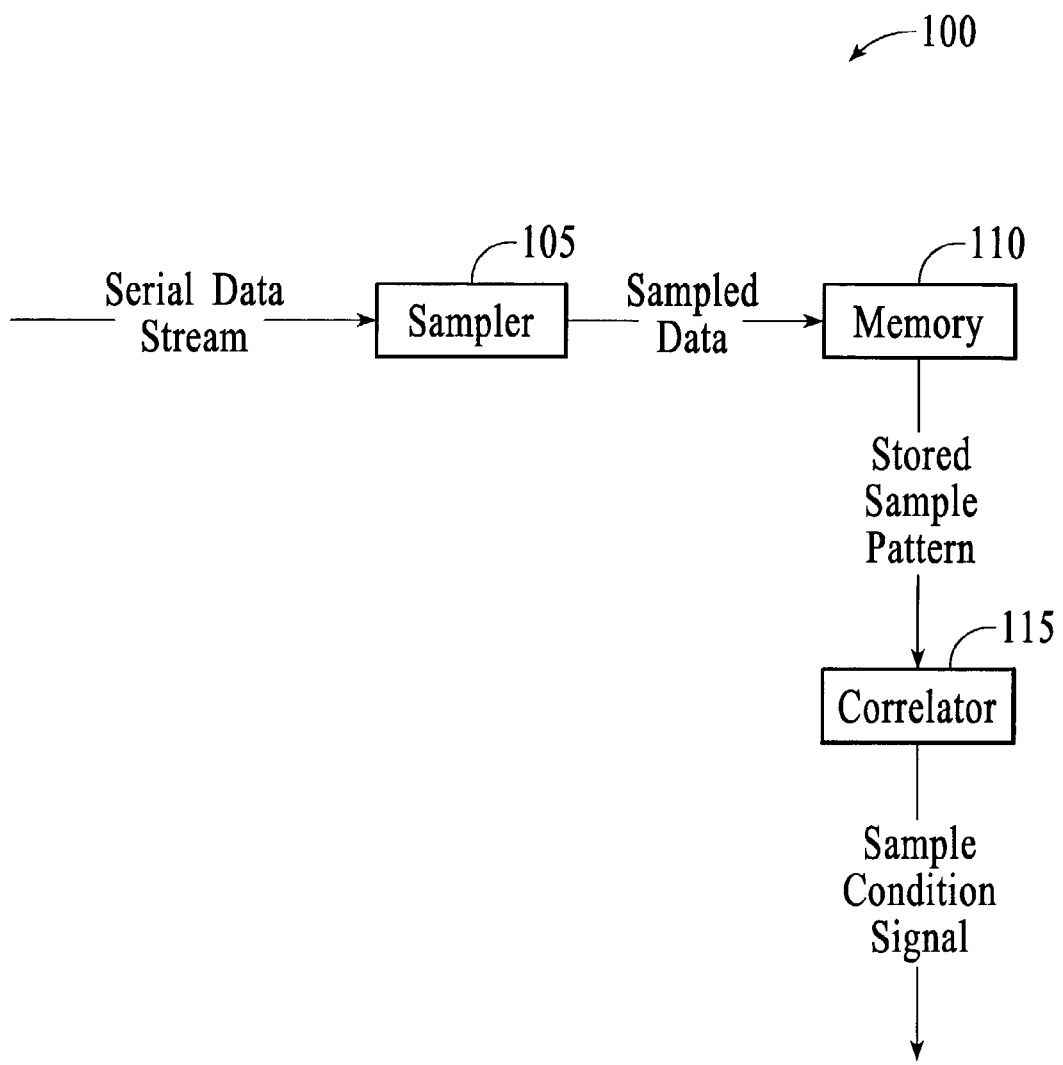
FIG. 1 is a schematic block diagram of a preferred embodiment for an edge detection system.

The present invention relates to evaluating a data group of oversampled bits to detect edge transitions and for improving use of information available from a sampled data while maintaining acceptable noise rejection. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

FIG. 1 is a schematic block diagram of a preferred embodiment for an edge detection system 100. Edge detection system 100 includes a sampler 105, a memory 110 and a correlator 115. Sampler 105 receives a data stream, typically a serial data stream, and generates a set of sampled data. In the preferred embodiment, sampler 105 oversamples the data and takes multiple successive samples during each bit time of the data cells of the input data stream. The sampled data is put into memory 110 where it may be aligned and processed to provide a sample word appropriate for the analysis. In the preferred embodiment, the last bits from a previous sample may be appended to the sampled data from the current data, but other configurations or arrangements of the bits may be desirable. The sample data pattern of the preferred embodiment thus has a total of seven (7) bits: three (3) bits from a current sample arranged in time order and stored with or otherwise associated with two (2) bits of a previous word and with two (2) bits of a next word as a pattern in memory 110. In the preferred embodiment, a single sample pattern word is stored in memory 110 at one time for pattern recognition. In other applications, it may be desirable or advantageous to sample and/or store a greater number of bits per a particular bit time, and/or take samples across multiple bit cells, and/or store multiple pattern words in memory 110 for analysis.

Correlator 115 reads the stored sample pattern or patterns from memory 110 and produces a sample condition signal using a set of predefined patterns by comparing the stored sampled pattern or patterns to the predefined patterns. Correlator 115 may be implemented, for example, as a look up table or a set of combinatorial logic gates that logically output an appropriate sample condition responsive to the stored sample pattern of seven bits as described above. One use of the present invention is disclosed in co-pending application Digital Adaptive Control Loop for Data Deserialization (RPS920020086US1), filed Oct. 7, 2002 and assigned application Ser. No. 10/265,759.

FIG. 2 is a chart depicting a preferred embodiment for predefined patterns and the corresponding sample condition signal. FIG. 2 is a pattern recognition table 200 including four columns, with each column having three fields. The first field is the stored sample pattern, the second field is a two-bit field of the output signal condition field and the third field is an alphanumeric character that helps to understand the quality of the data in the second field. FIG. 2 thus includes predetermined information for all 256 combinations of the seven bits making up the preferred format for the stored sample pattern. The second field is the sample condition signal that is the output from correlator 115. In the second field, a "10" means that an edge was detected early and a "01" means that an edge was detected late. A "00" means either that a detected edge is positioned properly in the middle or that the pattern does not reliably provide information. There are four alpha-numeric codes used in field three: "G" representing that the edge is good or properly positioned, "*" representing that the data clearly represents a need to move the sampling system responsive to the early/late indication of the second field, "?" representing that the data probably indicates a need to move the sampling system responsive to the early/late indication of the second field, and "-" representing that the stored pattern does not have enough information. The chart shown in FIG. 2 is populated by careful analysis of the meaning of each of the 256 sample patterns in light of the actual system and in context of the data. For other systems employing the present invention, even with seven bit sample patterns, the chart may be subtly or drastically different. As described, system 100 is an improvement over the prior art in that all of the transition information in the sampled data is used in determining the sample condition signal. The sample condition signal generated in this fashion is more accurate, particularly with the introduction of noise or other data artifacts into an input data stream to be sampled.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. An edge detection system for receiving a serial data stream, comprising:
    a sampler for collecting a sample pattern from the serial data stream, the sample pattern including a succession of a plurality of data samples from the data stream with the plurality of data samples including multiple samples during a bit time associated with the data stream;
    a memory, coupled to the sampler, for storing one or more successive sample patterns, wherein the one or more successive sample patterns are stored with appended bits from a previous sample; and
    a correlator, coupled to the memory, for producing a sample condition signal using a set of predefined patterns by comparing the stored sampled patterns to the predefined patterns, and for producing a code that indicates the quality of the data in the sample condition signal.

2. The edge detection system of claim 1 wherein the set of predefined patterns is stored in a logic table.

3. The edge detection system of claim 1 wherein the set of predefined patterns is embedded in combinatorial logic.

4. The edge detection system of claim 1 wherein the sample condition signal is selected from the set of good, early, and late.

5. The edge detection system of claim 4 wherein the set for the sample condition signal additionally includes unknown, likely early and likely late.

6. An edge detection method, comprising the steps of:
    (a) collecting a sample pattern from a serial data stream, the sample pattern including a succession of a plurality of data samples from the data stream with the plurality of data samples including multiple samples during a bit time associated with the data stream;
    (b) storing one or more successive sample patterns, wherein the one or more successive sample patterns are stored with appended bits from a previous sample;
    (c) producing a sample condition signal using a set of predefined patterns by comparing the stored sampled patterns to the predefined patterns; and
    (d) producing a code that indicates the quality of the data in the sample condition signal to detect an edge.

7. An edge detection system, comprising:
    means for collecting a sample pattern from a serial data stream, the sample pattern including a succession of a plurality of data samples from the data stream with the plurality of data samples including multiple samples during a bit time associated with the data stream;
    means, coupled to the collecting means, for storing one or more successive sample patterns, wherein the one or more successive sample patterns are stored with appended bits from a previous sample; and
    means, coupled to the storing means, for producing a sample condition signal using a set of predefined patterns by comparing the stored sampled patterns to the predefined patterns, and for producing a code that indicates the quality of the data in the sample condition signal.

8. The edge detection system of claim 1 wherein each predefined pattern of the set of predefined patterns comprises a sample pattern field and a sample condition signal field.

* * * * *